US012811035B2

(12) United States Patent
Dutta et al.

(10) Patent No.: US 12,811,035 B2
(45) Date of Patent: Nov. 24, 2026

(54) SCALABLE THIN-FILM RESISTOR STRUCTURE

(71) Applicant: International Business Machines Corporation, Armonk, NY (US)

(72) Inventors: Ashim Dutta, Clifton Park, NY (US); Shravana Kumar Katakam, Lehi, UT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 568 days.

(21) Appl. No.: 18/367,553

(22) Filed: Sep. 13, 2023

(65) Prior Publication Data

US 2025/0087392 A1 Mar. 13, 2025

(51) Int. Cl.

| | |
|---|---|
| ***H01C 7/00*** | (2006.01) |
| ***H01C 1/142*** | (2006.01) |
| ***H01C 17/00*** | (2006.01) |
| ***H10D 1/47*** | (2025.01) |
| *H10D 1/40* | (2025.01) |
| *H10D 84/00* | (2025.01) |

(52) U.S. Cl.

CPC ............. *H01C 7/006* (2013.01); *H01C 1/142* (2013.01); *H01C 17/006* (2013.01); *H10D 1/474* (2025.01); *H10D 1/40* (2025.01); *H10D 84/209* (2025.01)

(58) Field of Classification Search

CPC ........ H01C 7/006; H01C 1/142; H01C 1/474; H10D 84/209; H10D 1/40

See application file for complete search history.

(56) References Cited

U.S. PATENT DOCUMENTS

| | | | |
|---|---|---|---|
| 5,468,995 | A | 11/1995 | Higgins, III |
| 5,485,138 | A | 1/1996 | Morris |
| 6,083,785 | A | 7/2000 | Segawa |
| 6,207,560 | B1 | 3/2001 | Lee |
| 6,232,042 | B1 | 5/2001 | Dunn et al. |

(Continued)

FOREIGN PATENT DOCUMENTS

| | | | | |
|---|---|---|---|---|
| CN | 114864685 A | * | 8/2022 | ........... H10D 30/015 |
| JP | 2002270770 A | * | 9/2002 | |

OTHER PUBLICATIONS

K. Fischer et al., "Low-k Interconnect Stack with multi-layer Air Gap and Tri-Metal-Insulator-Metal Capacitors for 14 nm High Volume Manufacturing," IEEE International Interconnect Technology Conference and 2015 IEEE Materials for Advanced Metallization Conference (IITC/MAM), May 2015, 3 pages.

(Continued)

*Primary Examiner* — Ida M Soward

(74) *Attorney, Agent, or Firm* — Kristofer Haggerty; Ryan, Mason & Lewis, LLP

(57) ABSTRACT

A semiconductor device includes a first metallization level including a first electrode and a second metallization level including a second electrode. A resistor structure is disposed between the first electrode and the second electrode. The resistor structure includes a first resistor element including a first side and a second side, wherein the first side has a larger area than an area of the second side, and a second resistor element stacked on the first resistor element, wherein the second resistor element contacts the second side of the first resistor element.

20 Claims, 6 Drawing Sheets

(56) References Cited

U.S. PATENT DOCUMENTS

| | | | | |
|---|---|---|---|---|
| 7,704,871 | B2 * | 4/2010 | Beach | H01C 7/006 257/757 |
| 8,400,257 | B2 * | 3/2013 | Lim | H01L 23/5228 338/308 |
| 10,232,613 | B2 | 3/2019 | Chen et al. | |
| 10,354,951 | B1 * | 7/2019 | Kande | H01L 23/5226 |
| 11,495,565 | B2 | 11/2022 | Motoyoshi | |
| 2004/0027234 | A1 | 2/2004 | Hashimoto et al. | |
| 2020/0058580 | A1 * | 2/2020 | Lin | H01L 23/5223 |
| 2022/0352347 | A1 | 11/2022 | Bao et al. | |

OTHER PUBLICATIONS

T. Ando et al., "CMOS Compatible MIM Decoupling Capacitor with Reliable Sub-nm EOT High-k Stacks for the 7 nm Node and Beyond," 2016 IEEE International Electron Devices Meeting (IEDM), Dec. 1, 2016, pp. 9.4.1-9.4.4.

* cited by examiner

SCALABLE THIN-FILM RESISTOR STRUCTURE

BACKGROUND

The field relates to semiconductors, and more specifically, to techniques for forming semiconductor structures including thin-film resistors.

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide structures and techniques for forming scalable thin-film resistors.

In one embodiment, a semiconductor device includes a first metallization level comprising a first electrode and a second metallization level comprising a second electrode. A resistor structure is disposed between the first electrode and the second electrode. The resistor structure comprises a first resistor element comprising a first side and a second side, wherein the first side has a larger area than an area of the second side, and a second resistor element stacked on the first resistor element, wherein the second resistor element contacts the second side of the first resistor element.

In another embodiment, a semiconductor device includes a first electrode disposed in a first a dielectric layer, a second electrode disposed in a second dielectric layer, and at least one resistor structure between the first electrode and the second electrode. The at least one resistor structure is disposed in a third dielectric layer, the at least one resistor structure comprising a first resistor element, and a second resistor element stacked on the first resistor element. A shape of the first resistor element widens in a direction away from the second resistor element, and a shape of the second resistor element narrows in a direction toward the first resistor element.

In another embodiment, a semiconductor device includes a first metallization level comprising a first electrode, a second metallization level comprising a second electrode, and a resistor structure disposed between the first electrode and the second electrode. The resistor structure comprises a first resistor element comprising a subtractive portion, and a second resistor element comprising a trench liner portion stacked on the subtractive portion. The subtractive portion comprises one of a conical shape and a trapezoidal shape and the trench liner portion comprises a V-shape.

These and other features and advantages of embodiments described herein will become more apparent from the accompanying drawings and the following detailed description.

DETAILED DESCRIPTION

Figure 1:
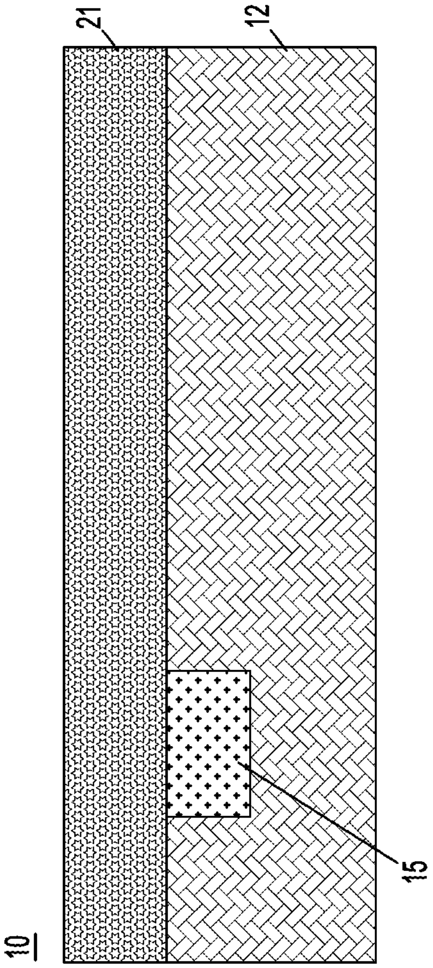
FIG. 1 is a schematic cross-sectional view of a semiconductor structure at an intermediate stage of fabrication following deposition of a first resistor layer on a first dielectric layer and bottom electrode, according to an embodiment of the invention.

Illustrative embodiments of the invention may be described herein in the context of illustrative structures and techniques for forming scalable thin-film resistors with varying critical dimensions, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers may be used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A resistor is a common electrical component used in electrical circuits, and can be found in most electrical devices. In semiconductor devices, thin-film resistors may be embedded in a chip. In illustrative embodiments, resistor structures are formed within back-end-of-line (BEOL), middle-of-line (MOL) and/or front-end of line (FEOL) interconnect layers between electrodes in different metallization layers. Depending on application, the electrodes may be connected to conductive lines including, but not necessarily limited to, power supply lines such as, for example, positive power supply lines (e.g., VDD lines) and negative power supply lines (e.g., ground or VSS lines), bitlines, wordlines and/or other types of conductive lines. As discussed in further detail below, the resistor structures are fabricated using various types of via contact (or simply via) configurations within the BEOL, MOL and/or FEOL interconnect structures to be connected between electrodes, including gate electrodes of transistors.

In illustrative embodiments, a resistor structure includes a conical or trapezoidal shaped resistor element and a V-shaped resistor element with a small contact area between the resistor elements. The resistor structure may include multiple resistor structures with the conical or trapezoidal and V-shaped resistor elements in a stacked configuration. The resistor stacks may comprise the same or different materials as each other and the resistor elements may have varied thicknesses and resistivities. The multiple resistor structures can be implemented in FEOL, MOL and BEOL applications.

Advantageously, the embodiments provide resistor structures that can have a wide range of critical dimensions and that can be scaled to smaller dimensions. The resistor structures can advantageously be applied to circuits used in, for example, cloud, machine learning and/or artificial intelligence applications.

FIGS. 1-7 schematically illustrate techniques for fabricating resistor structures between upper and lower metallization levels. There may be multiple resistor structures between electrodes including small contact areas between resistor elements. To begin, FIG. 1 is a schematic cross-sectional view of a semiconductor structure 10 at an intermediate stage of fabrication following deposition of a first resistor layer 21. The semiconductor structure 10 comprises a first inter-layer dielectric (ILD) layer 12 and a first electrode 15 formed in the first ILD layer 12. The first electrode may also be referred to herein as a bottom electrode.

The first ILD layer 12 is formed of any suitable dielectric material that is commonly utilized in FEOL, MOL or BEOL fabrication technologies. For example, the first ILD layer 12 can be formed of a dielectric material including, but not limited to, silicon oxide (e.g., $SiO_2$), silicon nitride (e.g., ($Si_3N_4$)), hydrogenated silicon carbon oxide (SiCOH), hydrogenated silicon carbide (SiCH), SiCNH, tetraethyl orthosilicate (TEOS), or other types of silicon-based low-k dielectrics (e.g., k less than about 4.0), porous dielectrics, or known ULK (ultra-low-k) dielectric materials (with k less than about 2.5). The first ILD layer 12 is deposited using known deposition techniques, such as, for example, ALD (atomic layer deposition), CVD (chemical vapor deposition), PECVD (plasma-enhanced CVD), or PVD (physical vapor deposition), or spin-on deposition.

The first electrode 15 (e.g., bottom electrode) is formed by a process which comprises patterning a trench in the first ILD layer 12, lining the trench with a liner layer (e.g., diffusion barrier and/or seed layer), and filling the trench with metallic material such as copper or other suitable metallic materials. In one embodiment, the first electrode 15 is formed as part of a lower metallization level (e.g., $M_{X-1}$ (see FIG. 7)).

The first resistor layer 21 is formed by depositing a layer of metallic material on the first ILD layer 12. In illustrative embodiments, the first resistor layer 21 is formed of tantalum nitride (TaN), titanium nitride (TiN), tungsten nitride (WN) or other metal nitrides or metal oxides, which are suitable for the given application.

Figure 2:
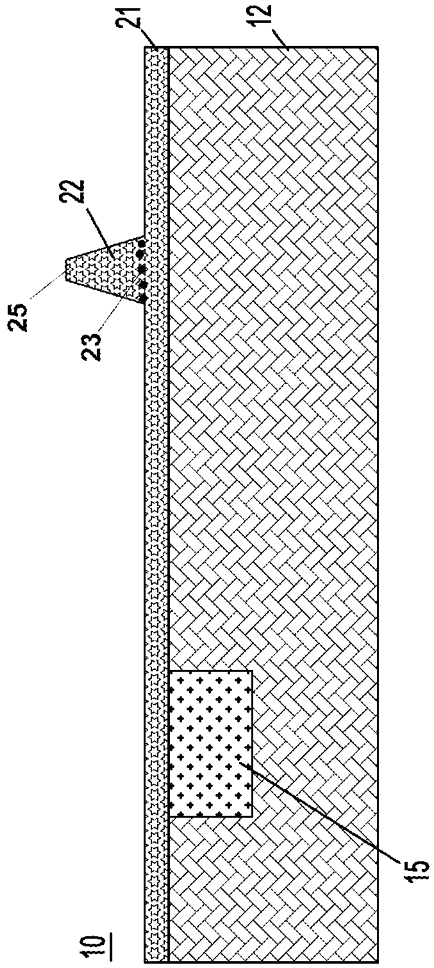
FIG. 2 is a schematic cross-sectional view of the semiconductor structure shown in FIG. 1 after patterning of the first resistor layer, according to an embodiment of the invention.

Referring to FIG. 2, the first resistor layer 21 is patterned in a subtractive etch process to form a first resistor element 22 on a remaining portion of the first resistor layer 21. A thickness (e.g., height with respect to the first ILD layer 12) of the remaining portion of the first resistor layer 21 can be, for example, in the range of about 1 nm to about 200 nm. The subtractive etch process removes exposed side portions of the first resistor layer 21 not covered by a mask (not shown), and also undercuts outer edges of the mask to remove some portions of the first resistor layer 21 under the mask. The first resistor element 22 may be referred to herein as a “subtractive portion” of a resistor structure. As can be seen in FIG. 2, as a result of the subtractive process, the first resistor element 22 increases in width (e.g., left to right direction in FIG. 2) from a top of the first resistor element 22 to a bottom of the first resistor element 22. In other words, the first resistor element 22 widens outward from a top portion (e.g., second side 25) to a bottom portion (e.g., first side 23 denoted by a dotted line as shown in FIG. 2). As can be seen in FIG. 2, the first resistor element 22 comprises a trapezoidal or conical shape, which increases in width and depth (e.g., into the page) from a top side of the first resistor element 22 to a bottom side of the first resistor element 22. As can be seen, the left and right sides of the first resistor element 22 in FIG. 2 are sloped in directions which increase the width of the first resistor element 22 in a direction toward the bottom side of the first resistor element 22 (e.g., toward the first ILD layer 12 comprising the first electrode 15). Given a true conical shape, the diameter of the first resistor element 22 increases from a top side of the first resistor element 22 to a bottom side of the first resistor element 22. In some embodiments, the top side of the first resistor element 22 may be flat as shown in FIG. 2. In other embodiments, the top side of the first resistor element 22 may come to a point where the left and right sides meet. The subtractive etching process is performed using etch chemistries such as $O_2/Cl_2$ and $O_2/CF_4$ as some example combinations, while masking portions of the first resistor layer 21 that are not to be etched. The etch chemistries can vary depending on the film to be etched. As can be seen in FIG. 2, the top side of the first resistor element 22 has a larger area than the bottom side of the first resistor element 22.

Figure 3:
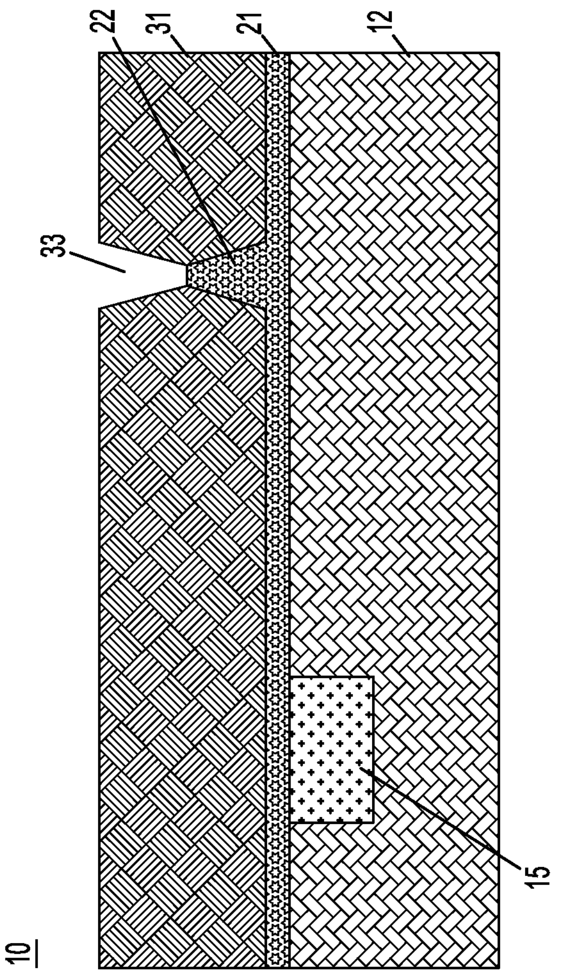
FIG. 3 is a schematic cross-sectional view of the semiconductor structure shown in FIG. 2 after deposition of a second dielectric layer and formation of a first via opening, according to an embodiment of the invention.

Referring to FIG. 3, a second ILD layer 31 is deposited on the structure of FIG. 2 comprising the first resistor element 22, the remaining portion of the first resistor layer 21 and the underlying first ILD layer 12 comprising the first electrode 15 formed therein. The second ILD layer 31 may be formed of a dielectric material the same as or similar to the dielectric material of the first ILD layer 12, and may be deposited using the same or similar techniques as those used for deposition of the first ILD layer 12. As shown in FIG. 3, a trench 33 (also referred to herein as a “via opening”) is formed in the second ILD layer 31. The trench 33 is formed by any suitable process which comprises (i) forming an etch mask on the second ILD layer 31 with openings exposing portions of the second ILD layer 31 where the trench 33 is to be formed; and (ii) anisotropically etching exposed portions of the second ILD layer 31 to expose the top side of the first resistor element 22. As can be seen, the trench 33 has a trapezoidal shape, wherein an area of the trench 33 decreases in a direction toward the first resistor element 22. As can be seen, the left and right sides of the trench 33 are sloped in directions which decrease the width (e.g., left and right directions in FIG. 3) of the trench 33 in a direction toward the first resistor element 22 (e.g., toward the first ILD layer 12 comprising the first electrode 15).

Figure 4:
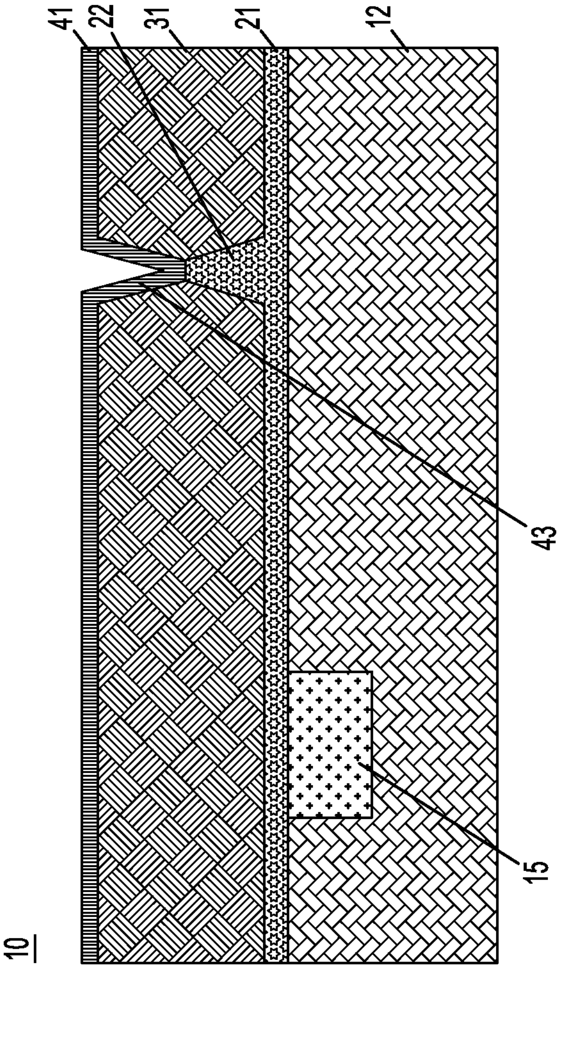
FIG. 4 is a schematic cross-sectional view of the semiconductor structure shown in FIG. 3 after deposition of a second resistor layer, according to an embodiment of the invention.

Referring to FIG. 4, a second resistor layer 41 is deposited on the second ILD layer 31 and in the trench 33. The second resistor layer 41 is formed by depositing a layer of metallic material on the second ILD layer 31 and in the trench 33. In illustrative embodiments, the second resistor layer 41 is formed from the same or similar material as that of the first resistor layer 21 such as, for example, TaN, TiN, WN or other metal nitrides or metal oxides, which are suitable for the given application. A thickness (e.g., height with respect to the second ILD layer 31) of the second resistor layer 41 can be, for example, in the range of about 1 nm to about 200 nm. As can be seen, a portion of the second resistor layer 41 in the trench 33 comprises the second resistor element 43 stacked on and contacting the top side of the first resistor element 22. The second resistor element 43 contacts the top side of the first resistor element 22 and comprises a conductive liner layer disposed in the trench 33 in the second ILD layer 31. The trench 33 is disposed over the first resistor element 22. The portion of the second resistor layer 41 in the trench 33 lines side surfaces and a bottom surface of the trench 33 to form a V-shape, with the narrow portion (e.g., small area portion) of the V-shape of the second resistor element 43 contacting the narrow portion (e.g., small area portion) of the trapezoidal or conical shape of the first resistor element 22. As can be seen in FIG. 4, the interface between the first and second resistor elements 22 and 43 comprises a narrow portion (e.g., small contact area portion similar to the center of an hourglass) in the hourglass-like shape formed by the second resistor element 43 stacked on the first resistor element 22. The interface portion between the second resistor element 43 and the first resistor element 22 may have a critical dimension between about 5 nm-about 300 nm.

Figure 5:
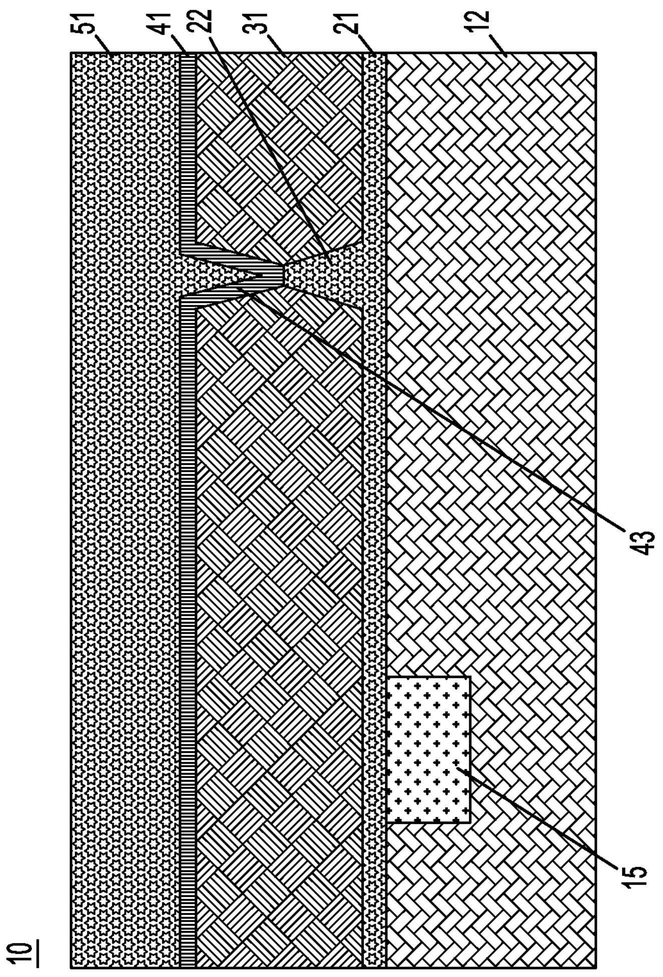
FIG. 5 is a schematic cross-sectional view of the semiconductor structure shown in FIG. 4 after deposition of a third resistor layer, according to an embodiment of the invention.

Referring to FIG. 5, a third resistor layer 51 is formed by depositing a layer of metallic material on the second resistor layer 41 and on the second resistor element 43 in the trench 33. In illustrative embodiments, the third resistor layer 51 is formed of the same or similar material as the first and/or second resistor layers 21 and 41 including, for example, TaN, TiN, WN or other metal nitrides or metal oxides, which are suitable for the given application.

Figure 6:
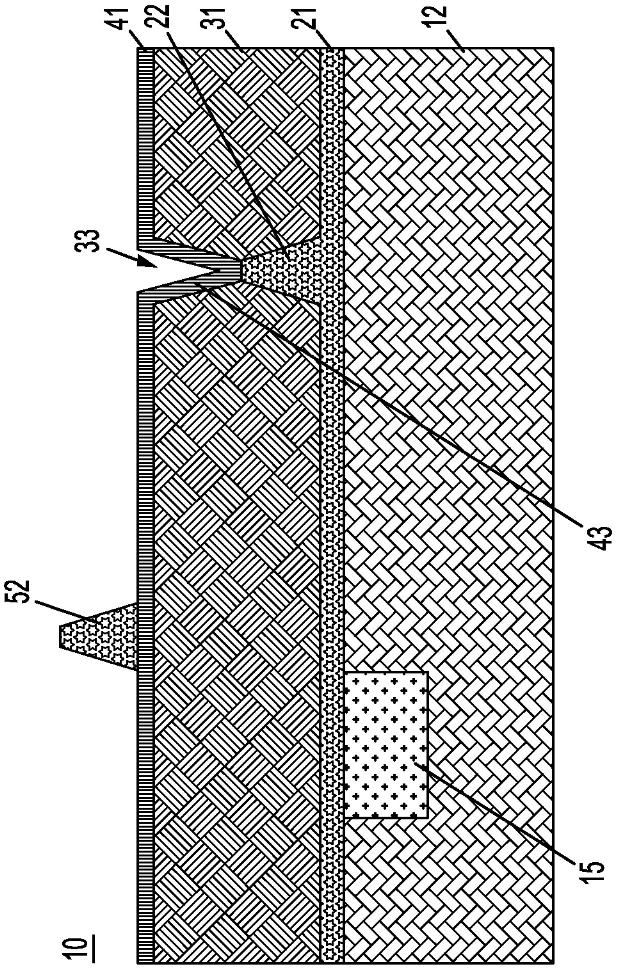
FIG. 6 is a schematic cross-sectional view of the semiconductor structure shown in FIG. 5 after patterning of the third resistor layer, according to an embodiment of the invention.

Referring to FIG. 6, similar to the first resistor layer 21, the third resistor layer 51 is patterned in a subtractive etch process to form a third resistor element 52 on a remaining portion of the second resistor layer 41. The subtractive etch process removes exposed side portions of the third resistor layer 51 not covered by a mask (not shown), and also undercuts outer edges of the mask to remove some portions of the third resistor layer 51 under the mask. In addition, the subtractive etch process removes a portion of the third resistor layer 51 from the trench 33 that was deposited on the second resistor element 43. The subtractive etching process is stopped so that the second resistor layer 41 and the second resistor element 43 remain and are not removed. Like the first resistor element 22, the third resistor element 52 may be referred to herein as a "subtractive portion" of a resistor structure. As can be seen in FIG. 6, as a result of the subtractive process, the third resistor element 52 increases in width (e.g., left to right direction in FIG. 6) from a top of the third resistor element 52 to a bottom of the third resistor element 52. In other words, the third resistor element 52 widens outward from a top portion to a bottom portion. As can be seen in FIG. 6, the third resistor element 52 comprises a trapezoidal or conical shape, which increases in width and depth (e.g., into the page) from a top side of the third resistor element 52 to a bottom side of the third resistor element 52. As can be seen, the left and right sides of the third resistor element 52 in FIG. 6 are sloped in directions which increase the width of the third resistor element 52 in a direction toward the bottom side of the third resistor element 52 (e.g., toward the first and second ILD layers 12 and 31). Given a true conical shape, the diameter of the third resistor element 52 increases from a top side of the third resistor element 52 to a bottom side of the third resistor element 52. In some embodiments, the top side of the third resistor element 52 may be flat as shown in FIG. 6. In other embodiments, the top side of the third resistor element 52 may come to a point where the left and right sides meet. The subtractive etching process is performed using etch chemistries such as $O_2/Cl_2$ and $O_2/CF_4$ as some example combinations, while masking portions of the third resistor layer 51 that are not to be etched. As can be seen in FIG. 6, the top side of the third resistor element 52 has a larger area than the bottom side of the third resistor element 52.

Figure 7:
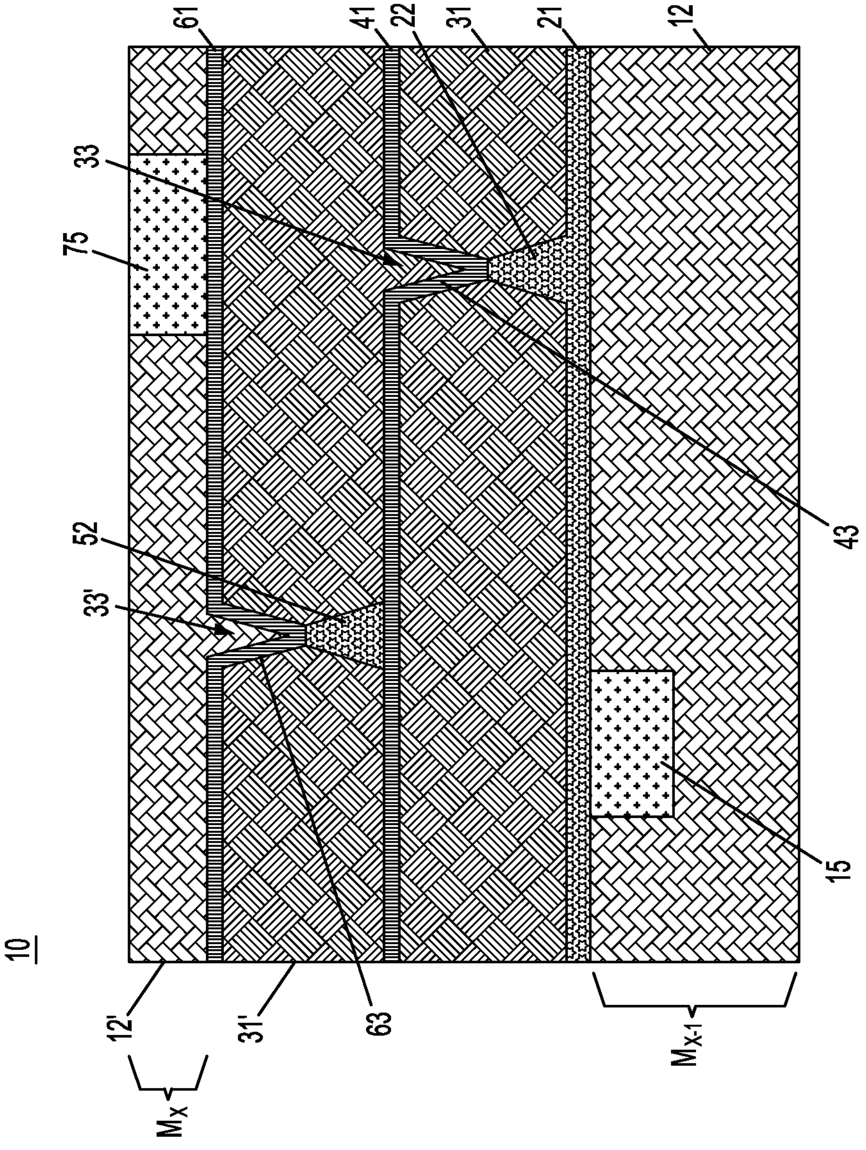
FIG. 7 is a schematic cross-sectional view of the semiconductor structure shown in FIG. 6 after deposition of a third dielectric layer and formation of a second via opening, deposition of a fourth resistor layer and a fourth dielectric layer and formation of a top electrode, according to an embodiment of the invention.

Referring to FIG. 7, a third ILD layer 31' is deposited on the structure of FIG. 6 comprising the third resistor element 52, the remaining portion of the second resistor layer 41, and the second resistor element 43 in the trench 33. The third ILD layer 31' fills in a remaining portion of the trench 33. The third ILD layer 31' may be formed of a dielectric material the same as or similar to the dielectric material of the first and/or second ILD layers 12 and 31, and may be deposited using the same or similar techniques as those used for deposition of the first and/or second ILD layers 12 and 31. As shown in FIG. 7, a trench 33' (also referred to herein as a "via opening") is formed in the third ILD layer 31'. The trench 33' is formed by any suitable process which comprises (i) forming an etch mask on the third ILD layer 31' with openings exposing portions of the third ILD layer 31' where the trench 33' is to be formed; and (ii) anisotropically etching exposed portions of the third ILD layer 31' to expose the top side of the third resistor element 52. As can be seen, like the trench 33, the trench 33' has a trapezoidal shape, wherein an area of the trench 33' decreases in a direction toward the third resistor element 52. As can be seen, the left and right sides of the trench 33' are sloped in directions which decrease the width (e.g., left and right directions in FIG. 7) of the trench 33' in a direction toward the third resistor element 52 (e.g., toward the first and second ILD layers 12 and 31).

A fourth resistor layer 61 is deposited on the third ILD layer 31' and in the trench 33'. The fourth resistor layer 61 is formed by depositing a layer of metallic material on the third ILD layer 31' and in the trench 33'. In illustrative embodiments, the fourth resistor layer 61 is formed from the same or similar material as that of the first, second and third resistor layers 21, 41 and 51 such as, for example, TaN, TiN, WN or other metal nitrides or metal oxides, which are suitable for the given application. A thickness (e.g., height with respect to the third ILD layer 31') of the fourth resistor layer 61 can be, for example, in the range of about 1 nm to about 200 nm. As can be seen, a portion of the fourth resistor layer 61 in the trench 33' comprises the fourth resistor element 63 stacked on and contacting the top side of the third resistor element 52. The fourth resistor element 63 contacts the top side of the third resistor element 52 and comprises a conductive liner layer disposed in the trench 33' in the third ILD layer 31'. The trench 33' is disposed over the third resistor element 52. The portion of the fourth resistor layer 61 in the trench 33' lines side surfaces and a bottom surface of the trench 33' to form a V-shape, with the narrow portion (e.g., small area portion) of the V-shape of the fourth resistor element 63 contacting the narrow portion (e.g., small area portion) of the trapezoidal or conical shape of the third resistor element 52. As can be seen in FIG. 7, like the interface between the first and second resistor elements 22 and 43, the interface between the third and fourth resistor elements 52 and 63 comprises a narrow portion (e.g., small contact area portion similar to the center of an hourglass) in the hourglass-like shape formed by the fourth resistor element 63 stacked on the third resistor element 52. The interface portion between the fourth resistor element 63 and the third resistor element 52 may have a critical dimension between about 5 nm-about 300 nm.

A fourth ILD layer 12' is deposited on the fourth resistor layer 61, and the fourth resistor element 63 in the trench 33'. The fourth ILD layer 12' fills in a remaining portion of the trench 33'. The fourth ILD layer 12' may be formed of a dielectric material the same as or similar to the dielectric material of the first, second and/or third ILD layers 12, 31 and 31', and may be deposited using the same or similar techniques as those used for deposition of the first, second and/or third ILD layers 12, 31 and 31'.

A second electrode 75 formed in the fourth ILD layer 12'. The second electrode may also be referred to herein as a top electrode. The second electrode 75 (e.g., top electrode) is formed by a process which comprises patterning a trench in the fourth ILD layer 12', lining the trench with a liner layer (e.g., diffusion barrier and/or seed layer), and filling the trench with metallic material such as copper or other suitable metallic materials. In one embodiment, the second electrode 75 is formed as part of an upper metallization level (e.g., $M_X$). Although third and fourth resistor elements 52 and 63 are shown in addition to the first and second resistor elements 22 and 43 disposed between the first and second electrodes 15 and 75, the embodiments are not necessarily limited thereto. Additional pairs of resistor elements in a stacked configuration similar to the pairs of first and second resistor elements 22 and 43, and third and fourth resistor elements 52 and 63 may be formed between and connected to the first and second electrodes 15 and 75.

As can be seen in FIG. 7, the top sides of the first and third resistor elements 22 and 52 face the upper metallization level $M_X$ and the bottom sides of the first and third resistor elements 22 and 52 face the lower metallization level $M_{X-1}$.

A dimension (e.g., width, diameter) of the first and third resistor elements 22 and 52 increases along a direction from the upper metallization level $M_X$ to the lower metallization level $M_{X-1}$. A dimension (e.g., width) of the trenches 33 and 33' decreases along the direction from the upper metallization level $M_X$ to the lower metallization level $M_{X-1}$. A shape of the second and fourth resistor elements 43 and 63 narrows along a direction from the upper metallization level $M_X$ to the lower metallization level $M_{X-1}$, and a shape of the first and third resistor elements 22 and 52 widens along a direction from the upper metallization level $M_X$ to the lower metallization level $M_{X-1}$.

A shape of the first resistor element 22 widens in a direction away from the second resistor element 43, and a shape of the second resistor element 43 narrows in a direction toward the first resistor element 22. Similarly, a shape of the third resistor element 52 widens in a direction away from the fourth resistor element 63, and a shape of the fourth resistor element 63 narrows in a direction toward the third resistor element 52. The first resistor layer 21 extended from the first resistor element 22 is disposed on the first ILD layer 12 and a portion of the first resistor layer 21 contacts the first electrode. The second resistor layer 41 extended from the second resistor element 43 is disposed on the second ILD layer 31 and a portion of the second resistor layer 41 contacts the third resistor element 52. The fourth resistor layer 61 extended from the fourth resistor element 63 is disposed on the third ILD layer 31' and a portion of the fourth resistor layer 61 contacts the second electrode 75. The second and fourth resistor elements 43 and 63 may be referred to herein as trench liner portions.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. An example integrated circuit includes one or more semiconductor devices with the above-described contact configurations and transistors stacked in a staggered configuration.

As noted above, illustrative embodiments correspond to structures and techniques for forming scalable resistor structures with reduced areas and increased resistance, along with illustrative apparatus, systems and devices formed using such methods. Multiple pairs of resistor structures between electrodes respectively include a conical or trapezoidal shaped resistor element and a V-shaped resistor element with a small contact area between the resistor elements. The embodiments permit resistor elements to have same or different materials as each other and the thicknesses and the resistivities of the resistor elements can vary. Advantageously, the embodiments provide scalable resistor structures that can be implemented in FEOL, MOL and BEOL applications with a wide range of critical dimensions.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as +5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:

a first metallization level comprising a first electrode;

a second metallization level comprising a second electrode; and a resistor structure disposed between the first electrode and the second electrode, wherein the resistor structure comprises:

a first resistor element comprising a first side and a second side, wherein the first side has a larger area than an area of the second side; and a second resistor element stacked on the first resistor element;

wherein a shape of the first resistor element widens in a direction away from the second side of the first resistor element, and a shape of the second resistor element narrows in a direction toward the second side of the first resistor element.

2. The semiconductor device of claim 1, wherein a dimension of the first resistor element increases along a direction from the second side to the first side.

3. The semiconductor device of claim 2, wherein the second side faces the second metallization level, and the first side faces the first metallization level.

4. The semiconductor device of claim 2, wherein a portion of the second resistor element contacting the second side of the first resistor element comprises a portion of a conductive liner layer disposed in a trench in a dielectric layer, wherein the trench is disposed over the first resistor element.

5. The semiconductor device of claim 4, wherein an area of the trench decreases in a direction toward the first resistor element.

6. The semiconductor device of claim 1, wherein the first resistor element has one of a conical shape and a trapezoidal shape.

7. The semiconductor device of claim 1, wherein a dimension of the first resistor element increases along a direction from the second metallization level to the first metallization level, wherein the second resistor element is disposed in a trench in a dielectric layer, and wherein a dimension of the trench decreases along the direction from the second metallization level to the first metallization level.

8. The semiconductor device of claim 1, further comprising an additional resistor structure disposed between the first electrode and the second electrode, wherein the additional resistor structure is disposed on a portion of a resistor layer extended from the second resistor element and comprises:

a third resistor element; and a fourth resistor element stacked on the third resistor element.

9. The semiconductor device of claim 8, wherein a first side of the third resistor element has a larger area than an area a second side of the third resistor element, and the fourth resistor element contacts the second side of the third resistor element.

10. The semiconductor device of claim 9, wherein a portion of the fourth resistor element contacting the second side of the third resistor element comprises a portion of a conductive liner layer disposed in a trench in a dielectric layer, wherein the trench is disposed over the third resistor element.

11. The semiconductor device of claim 1, wherein a shape of the second resistor element narrows along a direction from the second metallization level to the first metallization level, and a shape of the first resistor element widens along a direction from the second metallization level to the first metallization level.

12. A semiconductor device, comprising:

a first electrode disposed in a first a dielectric layer;

a second electrode disposed in a second dielectric layer; and at least one resistor structure between the first electrode and the second electrode, wherein the at least one resistor structure is disposed in a third dielectric layer, the at least one resistor structure comprising:

a first resistor element; and a second resistor element stacked on the first resistor element, wherein a shape of the first resistor element widens in a direction away from the second resistor element, and a shape of the second resistor element narrows in a direction toward the first resistor element.

13. The semiconductor device of claim 12, wherein the first resistor element comprises one of a conical shaped portion and a trapezoidal shaped portion and the second resistor element comprises a V-shaped portion.

14. The semiconductor device of claim 13, wherein the first resistor element comprises a layer extended from the one of the conical shaped portion and the trapezoidal shaped portion, wherein the layer is disposed on the first dielectric layer and a portion of the layer contacts the first electrode.

15. The semiconductor device of claim 13, wherein the second resistor element comprises a layer extended from the V-shaped portion, wherein the layer is disposed on the third dielectric layer.

16. The semiconductor device of claim 15, wherein a portion of the layer contacts at least one additional resistor structure disposed in a fourth dielectric layer between the first electrode and the second electrode.

17. The semiconductor device of claim 12, wherein the second resistor element comprises a conductive liner layer disposed in a trench in the third dielectric layer and contacting the first resistor element.

18. A semiconductor device, comprising:

a first metallization level comprising a first electrode;

a second metallization level comprising a second electrode; and a resistor structure disposed between the first electrode and the second electrode, wherein the resistor structure comprises:

a first resistor element comprising a subtractive portion; and a second resistor element comprising a trench liner portion stacked on the subtractive portion, wherein the subtractive portion comprises one of a conical shape and a trapezoidal shape, and the trench liner portion comprises a V-shape.

19. The semiconductor device of claim 18, wherein a shape of the subtractive portion widens in a direction away from the trench liner portion, and a shape of the trench liner portion narrows in a direction toward the subtractive portion.

20. The semiconductor device of claim 18, further comprising an additional resistor structure disposed between the first electrode and the second electrode, wherein the additional resistor structure is disposed on a layer extended from the trench liner portion and comprises:

a third resistor element comprising an additional subtractive portion; and a fourth resistor element comprising an additional trench liner portion stacked on the additional subtractive portion.

* * * * *